(12) United States Patent
Chen et al.

(10) Patent No.: US 9,583,399 B1
(45) Date of Patent: Feb. 28, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: I-Sheng Chen, Hsinchu (TW); Cheng-Hsien Wu, Hsinchu (TW); Chih Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/098,073

(22) Filed: Apr. 13, 2016

Related U.S. Application Data

(60) Provisional application No. 62/261,267, filed on Nov. 30, 2015.

(51) Int. Cl.
| | |
|---|---|
| *H01L 21/306* | (2006.01) |
| *H01L 21/8238* | (2006.01) |
| *H01L 29/24* | (2006.01) |
| *H01L 29/16* | (2006.01) |
| *H01L 29/423* | (2006.01) |
| *H01L 29/08* | (2006.01) |
| *H01L 29/78* | (2006.01) |
| *H01L 29/66* | (2006.01) |
| *H01L 27/092* | (2006.01) |
| *H01L 29/06* | (2006.01) |

(52) U.S. Cl.
CPC ........... *H01L 21/823821* (2013.01); *H01L 21/30604* (2013.01); *H01L 21/823814* (2013.01); *H01L 27/0924* (2013.01); *H01L 29/0673* (2013.01); *H01L 29/0847* (2013.01); *H01L 29/1608* (2013.01); *H01L 29/24* (2013.01); *H01L 29/42392* (2013.01); *H01L 29/6681* (2013.01); *H01L 29/66545* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 9,443,978 B2 * | 9/2016 | Bae .................. | H01L 29/785 |
| 2015/0295084 A1 * | 10/2015 | Obradovic ........ | H01L 29/7845 257/347 |
| 2016/0118304 A1 * | 4/2016 | Zang ............... | H01L 21/823807 438/694 |
| 2016/0233320 A1 * | 8/2016 | Chang ............... | H01L 21/3065 |

\* cited by examiner

*Primary Examiner* — Asok K Sarkar
(74) *Attorney, Agent, or Firm* — McDermott Will & Emery LLP

(57) ABSTRACT

A semiconductor device includes first channel layers disposed over a substrate, a first source/drain region disposed over the substrate, a gate dielectric layer disposed on and wrapping each of the first channel layers, and a gate electrode layer disposed on the gate dielectric layer and wrapping each of the first channel layers. Each of the first channel layers includes a semiconductor wire made of a first semiconductor material. The semiconductor wire extends into the first source/drain region. The semiconductor wire in the first source/drain regions is wrapped around by a second semiconductor material.

20 Claims, 19 Drawing Sheets

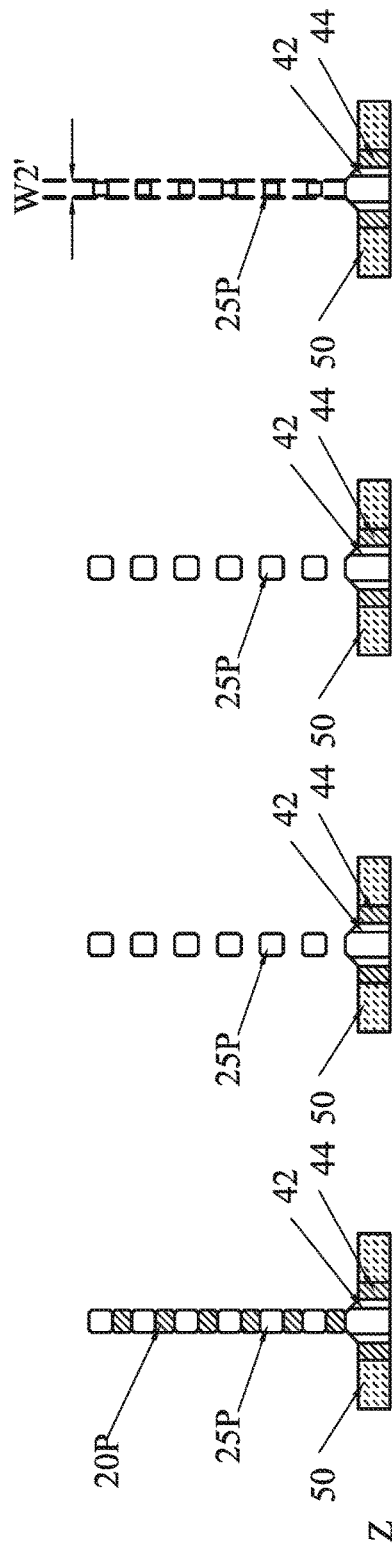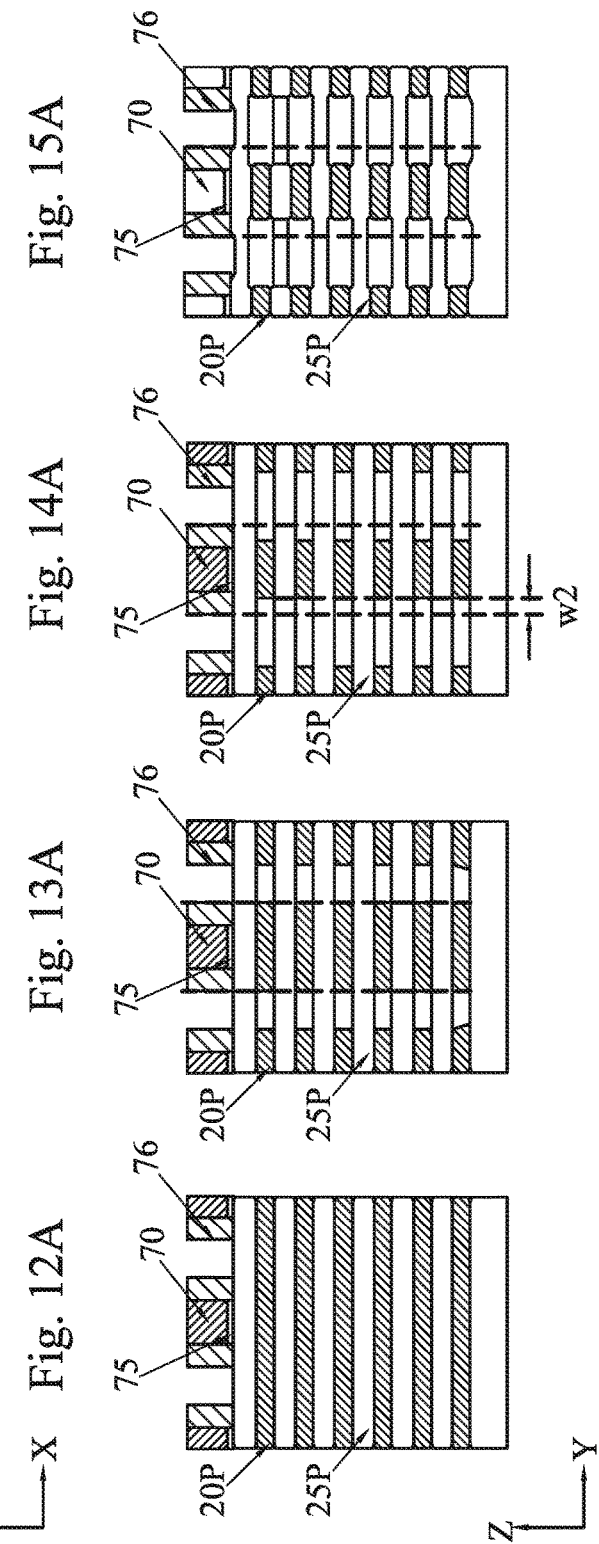

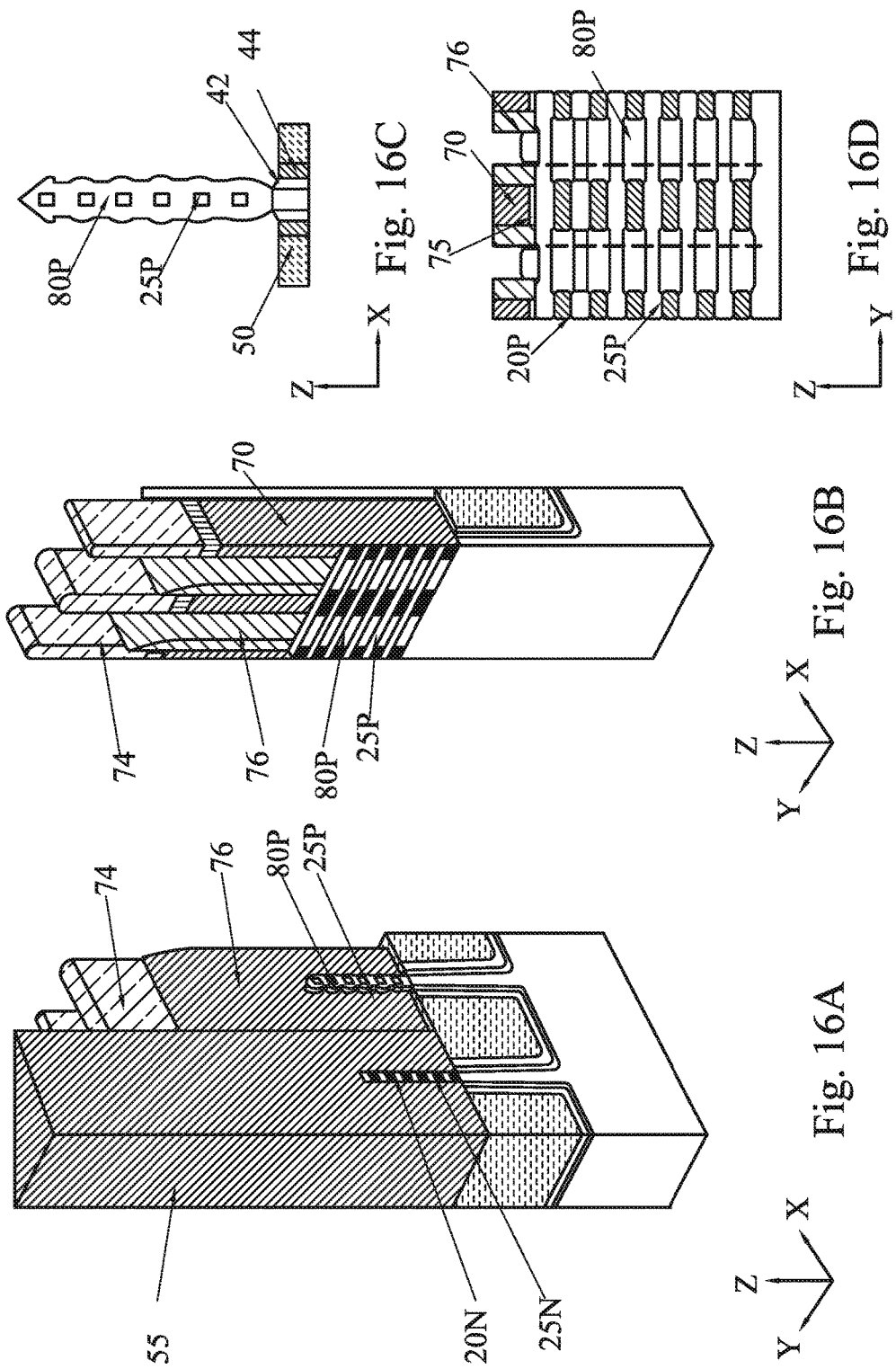

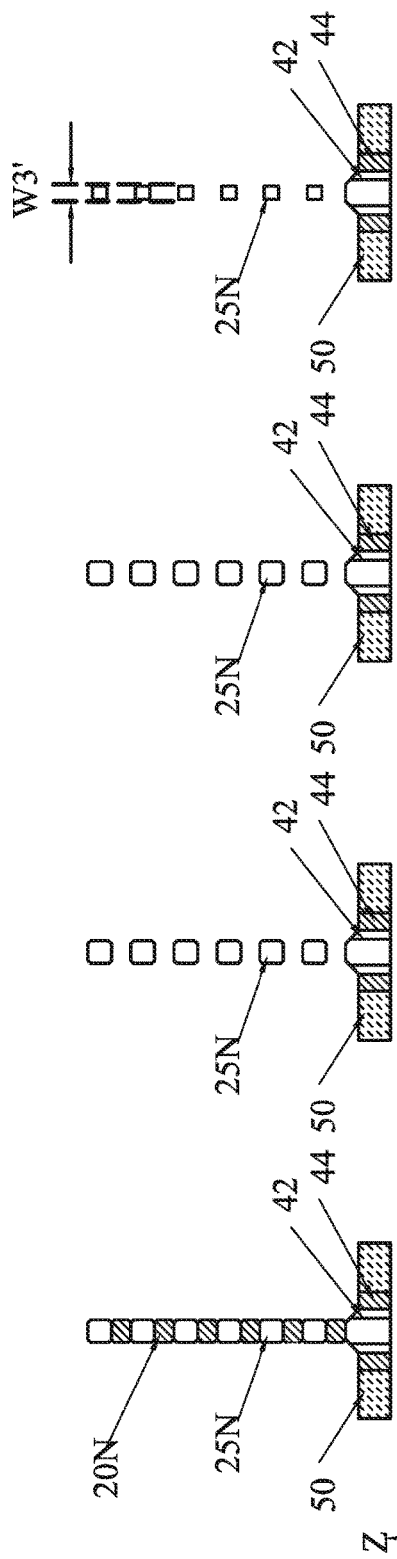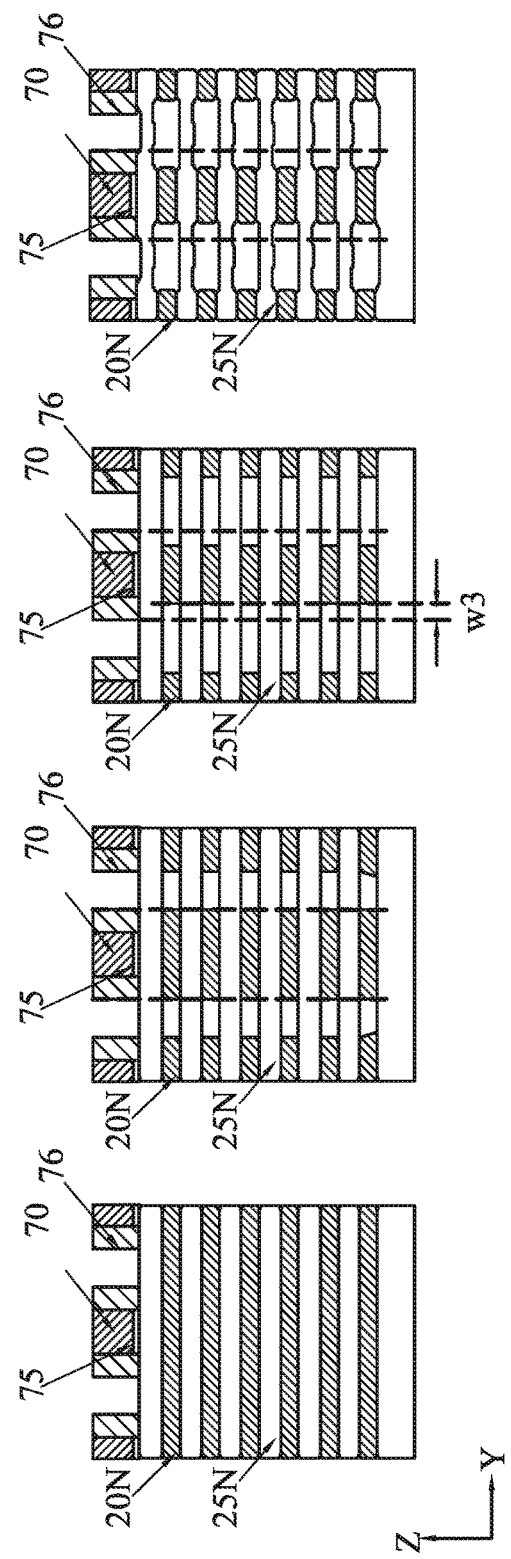

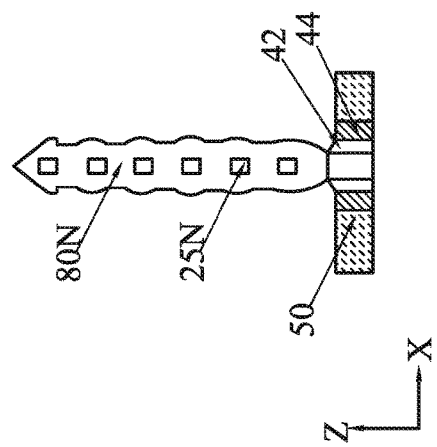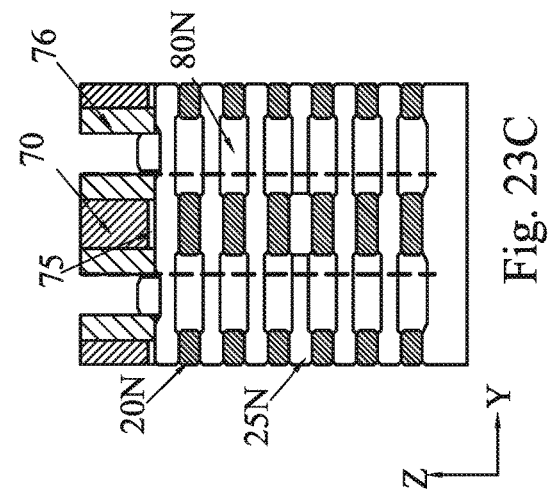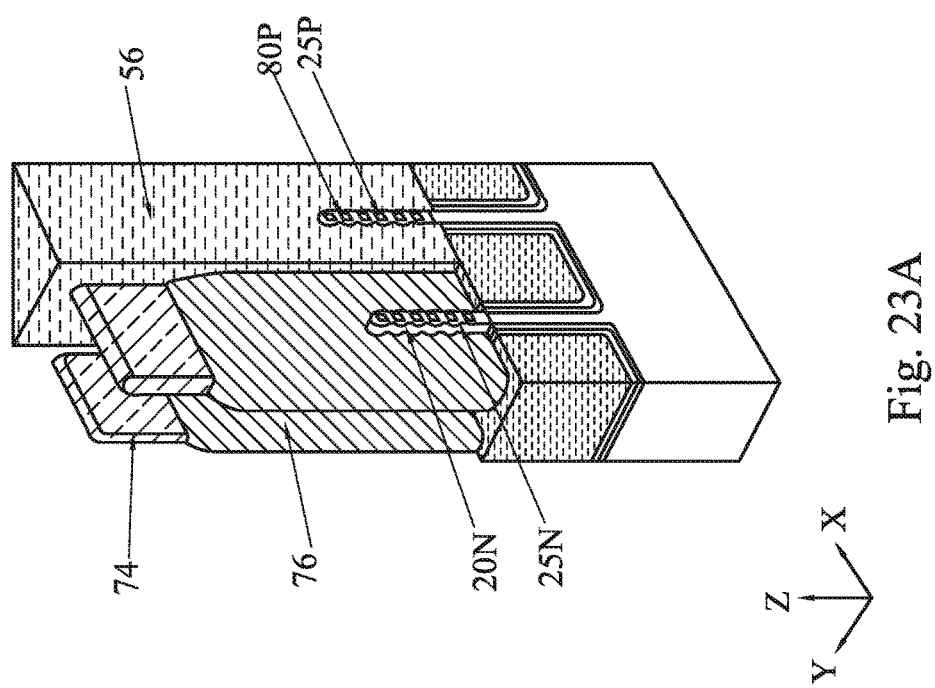
Fig. 23B
Fig. 23C
Fig. 23A

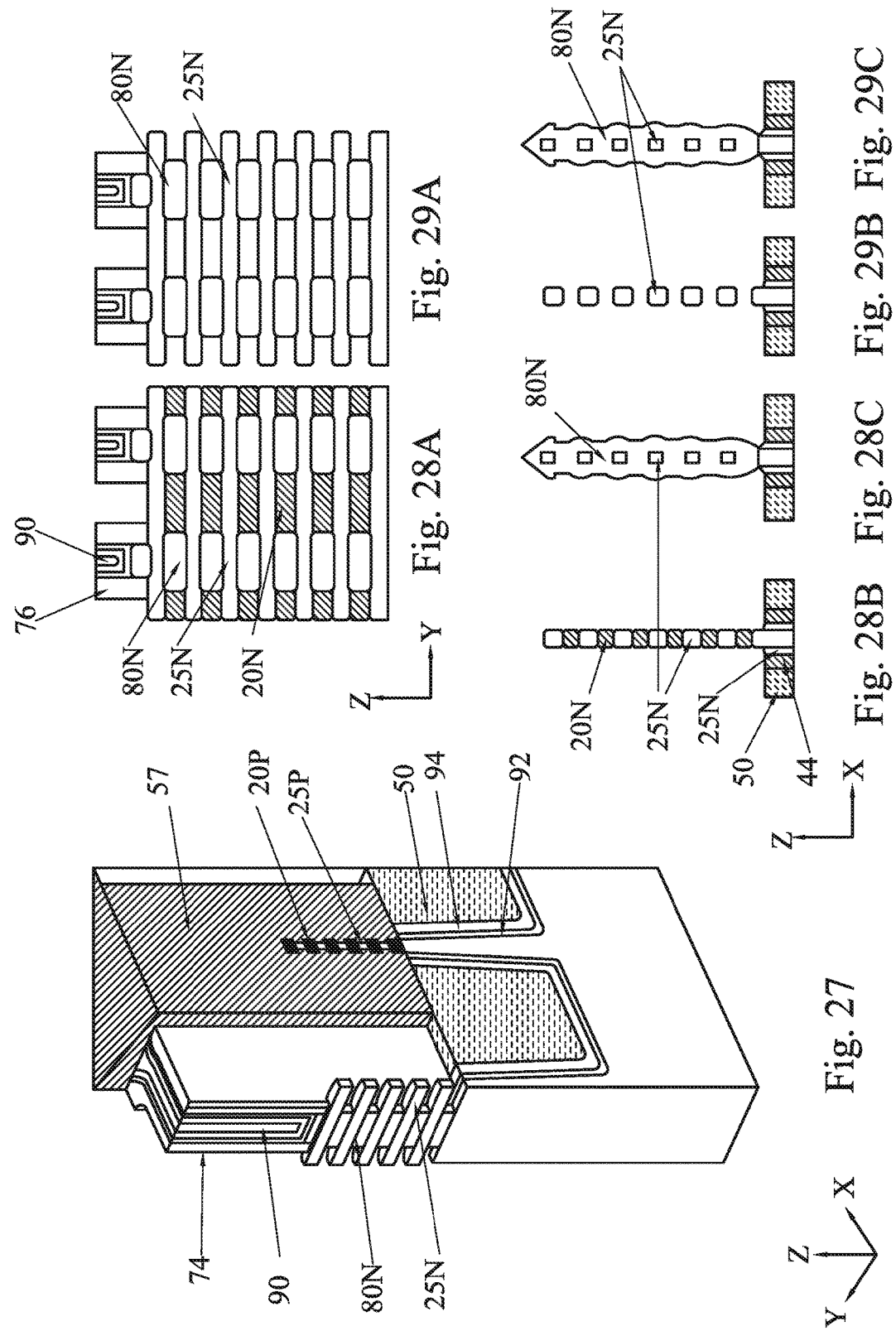

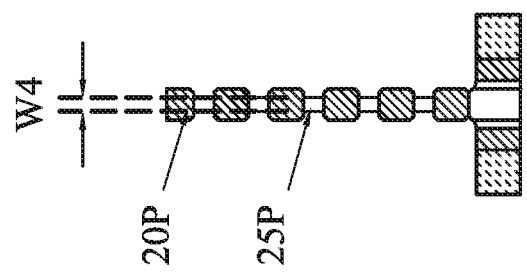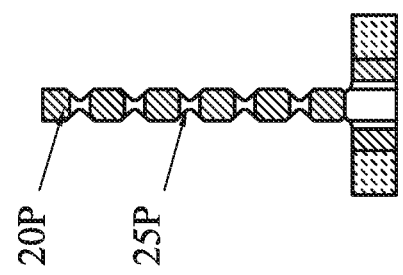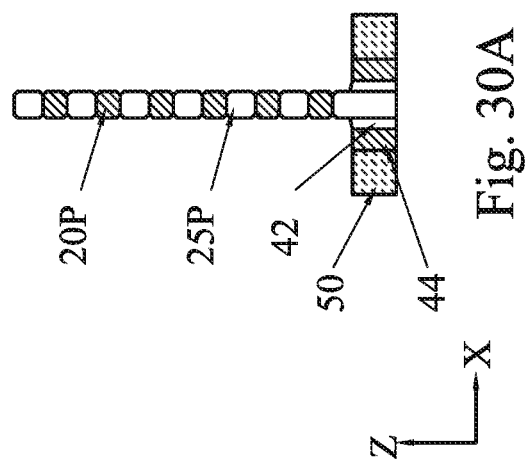

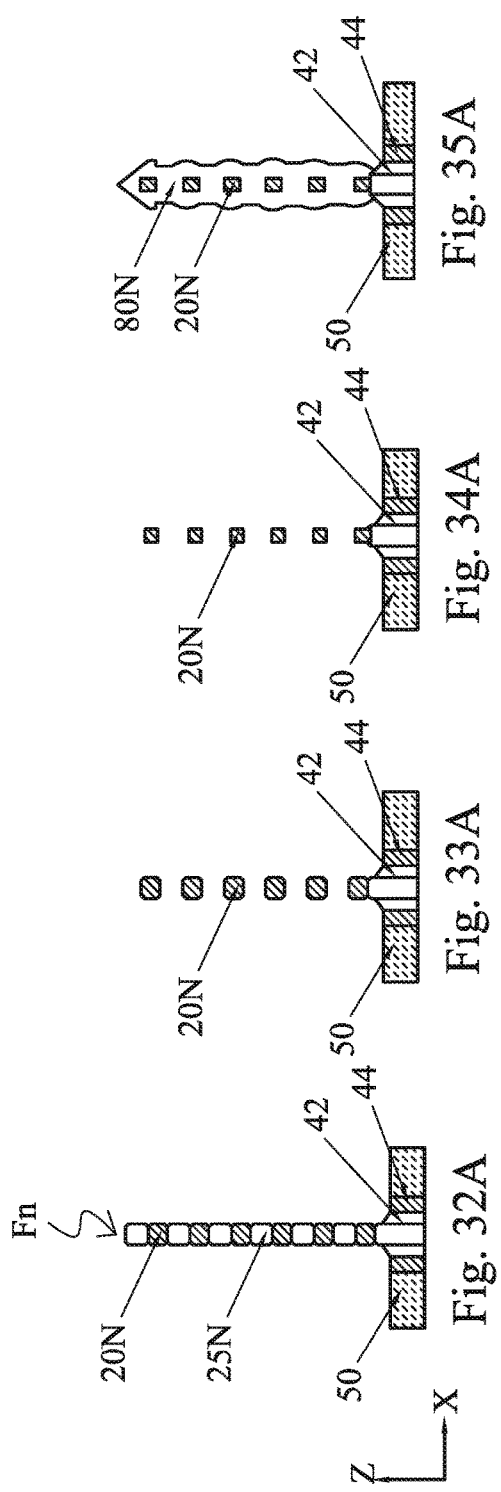
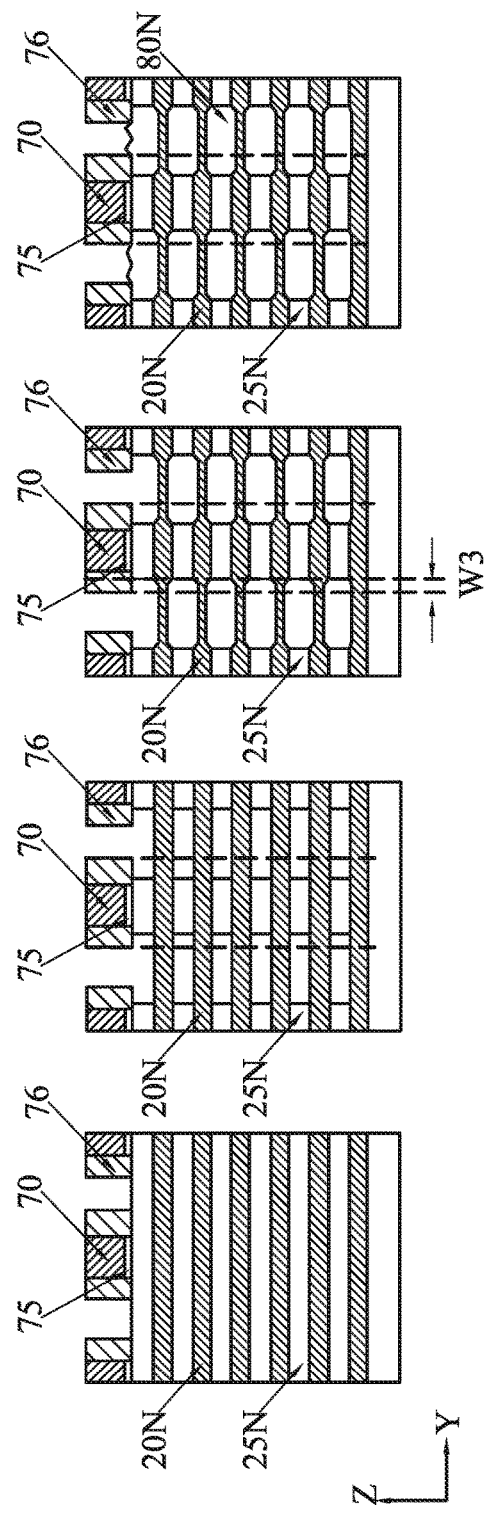

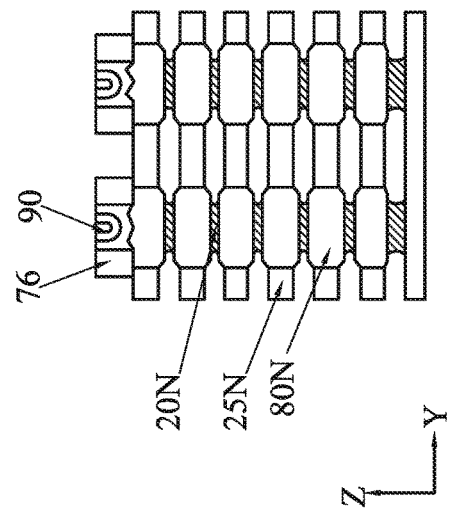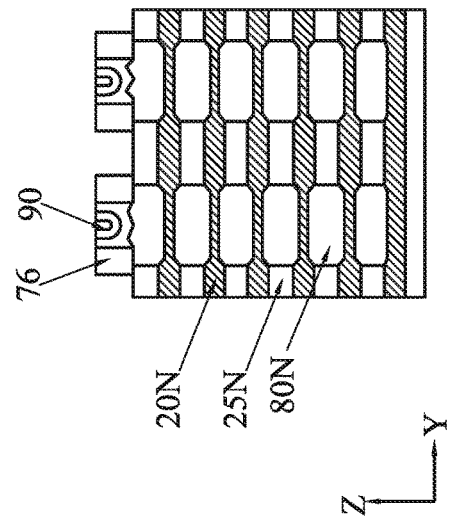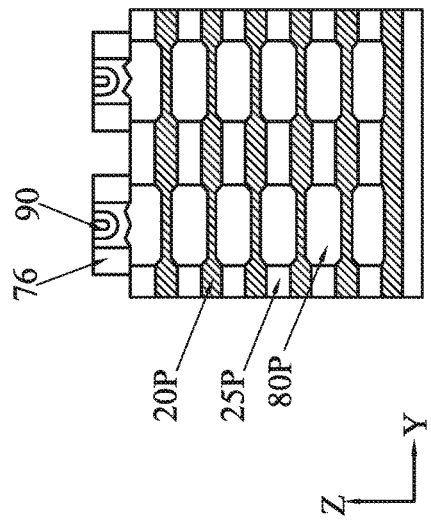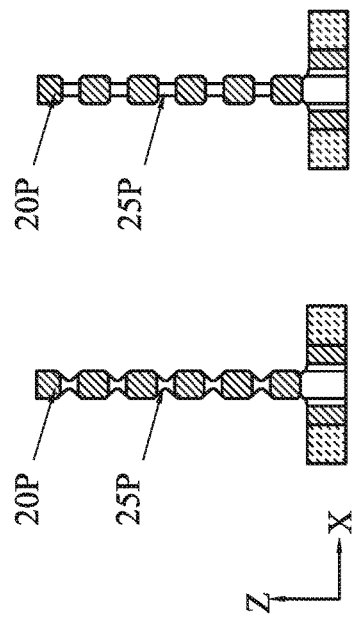

|  | P-FET |  |  | NFET |  |  |
|---|---|---|---|---|---|---|
| Channel | SiGe/Si | | | Si | | |
| S/D Etch | N/A | Si (FIG. 38) | SiGe (FIG. 15B) | N/A | Si (FIG. 34B) | SiGe (FIG. 22B) |
| S/D lateral Etch | N | N | Y | N | Y | Y |
| S/D Material | SiGe, Ge | | | SiP(SiC, SiCP) | | |
| Gate Etch | Si (partially) | (FIG. 39) | (FIG. 30B) | SiGe | (FIG. 37) | (FIG. 29A) |
| Gate etch stop layer | N | Y | N | N | N | Y |

Fig. 40

SEMICONDUCTOR DEVICE AND MANUFACTURING METHOD THEREOF

CROSS-REFERENCE TO RELATED APPLICATIONS

This application claims priority to U.S. Provisional Patent Application 62/261,267 filed Nov. 30, 2015, the entire disclosure of which is incorporated herein by reference.

TECHNICAL FIELD

The disclosure relates to a semiconductor integrated circuit, and more particularly to a semiconductor device having a gate-all-around structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to a steeper sub-threshold current swing (SS) and smaller drain induced barrier lowering (DIBL).

As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 12A and FIG. 12B shows one of the stages of exemplary sequential processes for manufacturing a GAA FET device according to one embodiment of the present disclosure.

FIG. 13A and FIG. 13B shows one of the stages of exemplary sequential processes for manufacturing a GAA FET device according to one embodiment of the present disclosure.

FIG. 14A and FIG. 14B shows one of the stages of exemplary sequential processes for manufacturing a GAA FET device according to one embodiment of the present disclosure.

FIG. 15A and FIG. 15B shows one of the stages of exemplary sequential processes for manufacturing a GAA FET device according to one embodiment of the present disclosure.

FIG. 16A, FIG. 16B, FIG. 16C and FIG. 16D show exemplary sequential processes for manufacturing a GAA FET device according to one embodiment of the present disclosure.

FIG. 19A and FIG. 19B shows one of the stages of exemplary sequential processes for manufacturing a GAA FET device according to one embodiment of the present disclosure.

FIG. 20A and FIG. 20B shows one of the stages of exemplary sequential processes for manufacturing a GAA FET device according to one embodiment of the present disclosure.

FIG. 21A and FIG. 21B shows one of the stages of exemplary sequential processes for manufacturing a GAA FET device according to one embodiment of the present disclosure.

FIG. 22A and FIG. 22B shows one of the stages of exemplary sequential processes for manufacturing a GAA FET device according to one embodiment of the present disclosure.

FIG. 23A, FIG. 23B and FIG. 23C shows one of the stages of exemplary sequential processes for manufacturing a GAA FET device according to one embodiment of the present disclosure.

FIG. 27 shows one of the stages of exemplary sequential processes for manufacturing a GAA FET device according to one embodiment of the present disclosure.

FIG. 28A, FIG. 28B and FIG. 28C shows one of the stages of exemplary sequential processes for manufacturing a GAA FET device according to one embodiment of the present disclosure.

FIG. 29A, FIG. 29B and FIG. 29C shows one of the stages of exemplary sequential processes for manufacturing a GAA FET device according to one embodiment of the present disclosure.

FIG. 30A, FIG. 30B and FIG. 30C shows one of the stages of exemplary sequential processes for manufacturing a GAA FET device according to one embodiment of the present disclosure.

FIG. 32 A and FIG. 32B shows one of the stages of an exemplary process for manufacturing a GAA FET device according to other embodiments of the present disclosure.

FIG. 33 A and FIG. 32B shows one of the stages of an exemplary process for manufacturing a GAA FET device according to other embodiments of the present disclosure.

FIG. 34 A and FIG. 34B shows one of the stages of an exemplary process for manufacturing a GAA FET device according to other embodiments of the present disclosure.

FIG. 35A and FIG. 35B shows one of the stages of an exemplary process for manufacturing a GAA FET device according to other embodiments of the present disclosure.

FIG. 36 shows one of the stages of an exemplary process for manufacturing a GAA FET device according to other embodiments of the present disclosure.

FIG. 37 shows one of the stages of an exemplary process for manufacturing a GAA FET device according to other embodiments of the present disclosure.

FIG. 38 shows one of the stages of an exemplary process for manufacturing a GAA FET device according to other embodiments of the present disclosure.

FIG. 39A and FIG. 39B shows one of the stages of an exemplary process for manufacturing a GAA FET device according to other embodiments of the present disclosure.

FIG. 40 is a table showing combinations of S/D structures and channel etching processes according to various embodiments of the present disclosure

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-31 show exemplary sequential processes for manufacturing the GAA FET device according to one embodiment of the present disclosure. It is understood that additional operations can be provided before, during, and after processes shown by FIGS. 1-31, and some of the operations described below can be replaced or eliminated, for additional embodiments of the method. The order of the operations/processes may be interchangeable.

Figure 1:
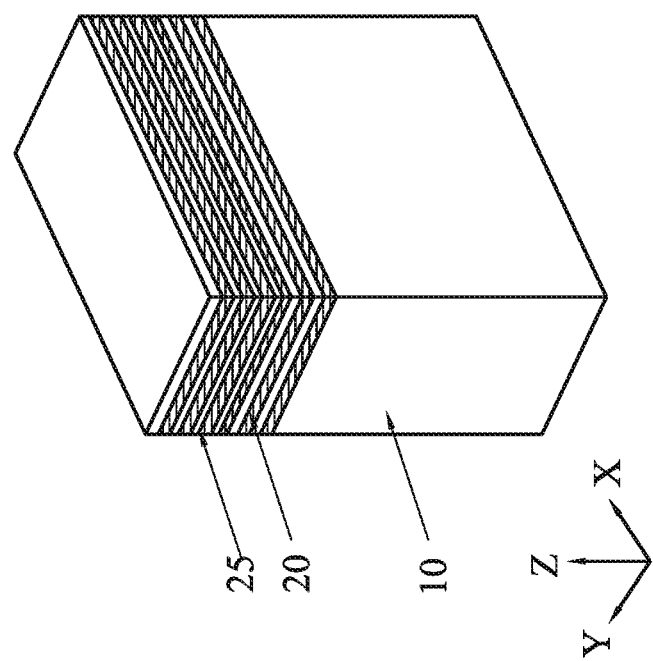
FIG. 1 shows one of the stages of exemplary sequential processes for manufacturing a GAA FET device according to one embodiment of the present disclosure.

As shown in FIG. 1, stacked semiconductor layers are formed over a substrate 10. The stacked semiconductor layers include first semiconductor layers 20 and second semiconductor layers 25.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. In the present disclosure, a source and drain are interchangeably used and there is substantially no structural difference. The term "a source/drain" (an S/D) refers to one of a source and a drain. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb and InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4. In one embodiment of the present disclosure, the first semiconductor layers 20 are made of $Si_{1-x}Ge_x$, where 0.1<x<0.9 (hereinafter referred to as SiGe), and the second semiconductor layers 25 are made of Si.

In FIG. 1, six layers of the first semiconductor layer 20 and six layers of the second semiconductor layer 25 are disposed. However, the number of the layers are not limited to six, and may be as small as 1 (each layer). In some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, and is in a range from 20 nm to 40 nm in other embodiments.

Figure 2:
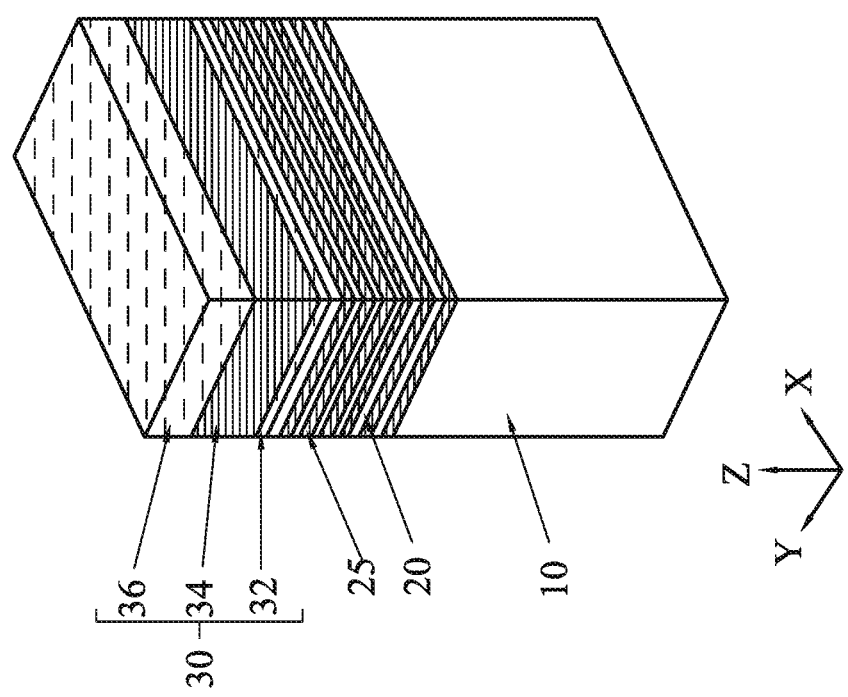
FIG. 2 shows one of the stages of exemplary sequential processes for manufacturing a GAA FET device according to one embodiment of the present disclosure.

Next, as shown in FIG. 2 a mask layer 30 is formed over the stacked layers. In some embodiments, the mask layer 30 includes a first mask layer 32, a second mask layer 34 and a third mask layer 36. The first mask layer 32 is a pad oxide layer made of a silicon oxide, which can be formed by a thermal oxidation. The second mask layer 34 is made of a silicon nitride (SiN) and the third mask layer 36 is made of a silicon oxide, both of which are formed by chemical vapor deposition (CVD), including low pressure CVD (LPCVD) and plasma enhanced CVD (PECVD); physical vapor deposition (PVD); atomic layer deposition (ALD); or other suitable process. The mask layer 30 is patterned into a mask pattern by using patterning operations including photolithography and etching.

Figure 3:
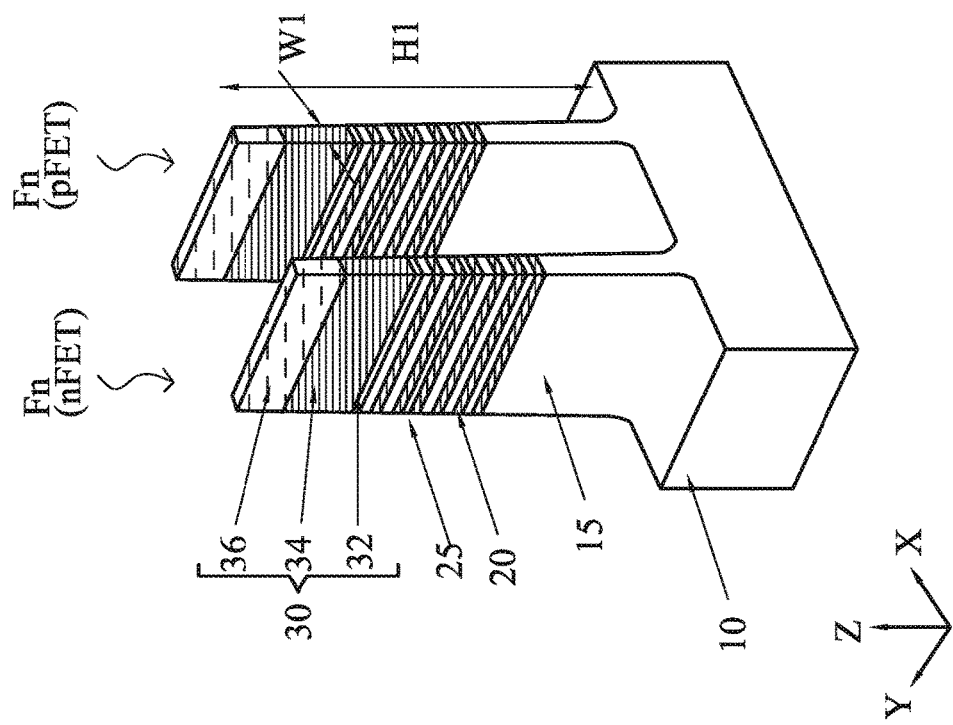
FIG. 3 shows one of the stages of exemplary sequential processes for manufacturing a GAA FET device according to one embodiment of the present disclosure.

Next, as shown in FIG. 3, the stacked layers of the first and second semiconductor layers 20, 25 are patterned by using the patterned mask layer, thereby the stacked layers are formed into fin structures Fn and Fp extending in the Y direction. In the subsequent fabrication operations, the fin structure Fn is used to form an n-type FET and the fin structure Fp is used to formed a p-type FET. Each of the fin structures includes a bottom layer 15, which is a part of the etched substrate.

The width W1 of the fin structure along the X direction is in a range from about 5 nm to about 40 nm in some embodiments, and is in a range from about 6 nm to about 15 nm in other embodiments. The height H1 along the Z direction of the fin structure is in a range from about 30 nm to about 200 nm.

Figure 4:
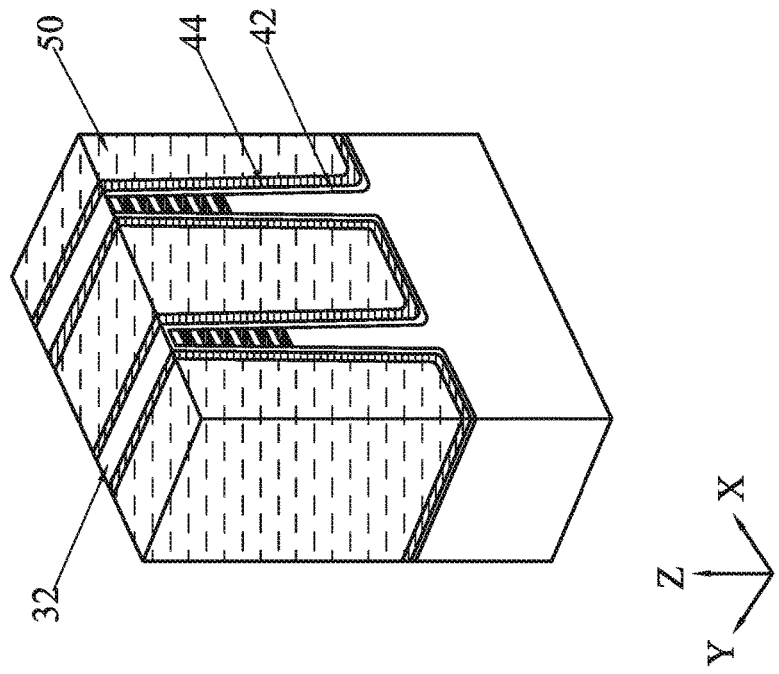
FIG. 4 shows one of the stages of exemplary sequential processes for manufacturing a GAA FET device according to one embodiment of the present disclosure.

After the fin structure is formed, an isolation insulating layer 50 including one or more layers of insulating material is formed over the substrate so that the fin structures are fully embedded in the insulating layer 50. The insulating material for the insulating layer 50 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 50. Then, a planarization operation, such as a chemical mechanical polishing (CMP) method and/or an etch-back method, is performed such that the upper surface of the pad oxide layer 32 is exposed from the insulating material layer as shown in FIG. 4. In some embodiments, the upper surface of the fin structures is exposed.

In some embodiments, a first liner layer 42 is formed over the structure of FIG. 3 and a second liner layer 44 is further formed over the first liner layer 42, as shown FIG. 4. The first liner layer 42 is made of silicon oxide or a silicon oxide-based material and the second liner layer 44 is made of SiN or a silicon nitride-based material. In some embodiments, the second liner layer 44 is made of silicon oxide or a silicon oxide-based material and the first liner layer 42 is made of SiN or a silicon nitride-based material.

Figures 5, 6:
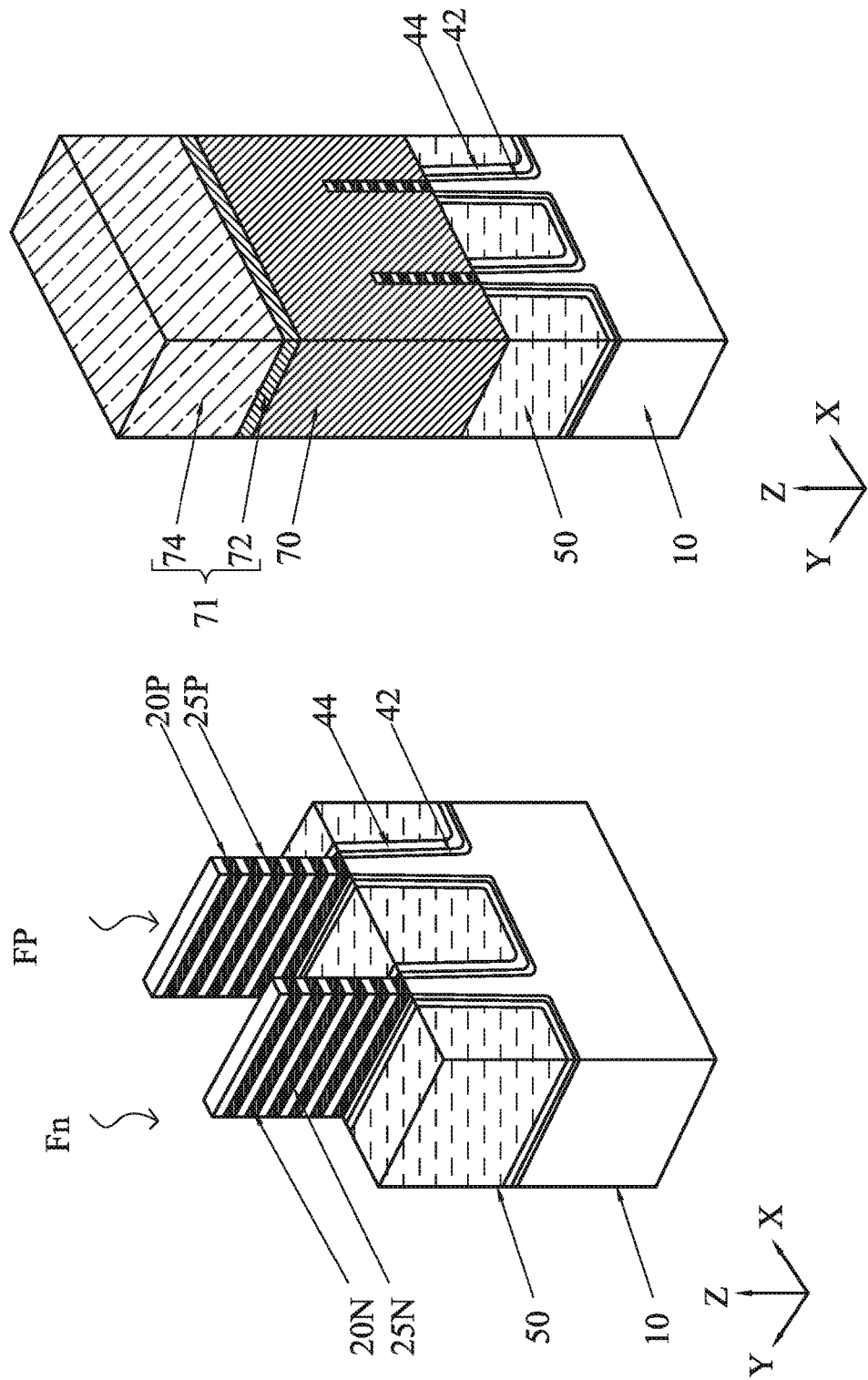
FIG. 5 shows one of the stages of exemplary sequential processes for manufacturing a GAA FET device according to one embodiment of the present disclosure.
FIG. 6 shows one of the stages of exemplary sequential processes for manufacturing a GAA FET device according to one embodiment of the present disclosure.

Then, the insulating layer 50 is recessed to partially expose a part of the fin structures, as shown in FIG. 5. As shown in FIG. 5, the exposed fin structures Fp and Fn both include the stacked structure of the first semiconductor layer 20P and 20N and the second semiconductor layers 25P and 25N.

As shown in FIG. 5, the bottommost first semiconductor layer is fully exposed from the isolation insulating layer 50. In other embodiments, the bottommost first semiconductor layer is partially embedded in the isolation insulating layer 50.

After the upper portions (stacked layer portions) of the fin structures Fp and Fn are exposed, sacrificial gate structures are formed over the exposed fin structures.

The sacrificial gate structures are formed by first blanket depositing a sacrificial gate dielectric layer 75 (see, e.g., FIG. 12B) over the fin structures. The sacrificial gate dielectric layer includes one or more layers of silicon oxide, silicon nitride or silicon oxynitride. The thickness of the sacrificial gate dielectric layer is in a range from about 1 nm to about 5 nm in some embodiments. A sacrificial gate electrode layer 70 is then blanket deposited on the sacrificial gate dielectric layer and over the fin structures, such that the fin structures are fully embedded in the sacrificial gate electrode layer 70. The sacrificial gate electrode layer includes silicon such as poly crystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process.

Subsequently, a mask layer 71 is formed over the sacrificial gate electrode layer 70, as shown in FIG. 6. The mask layer 71 includes a pad SiN layer 72 and a silicon oxide mask layer 74.

Figure 7:
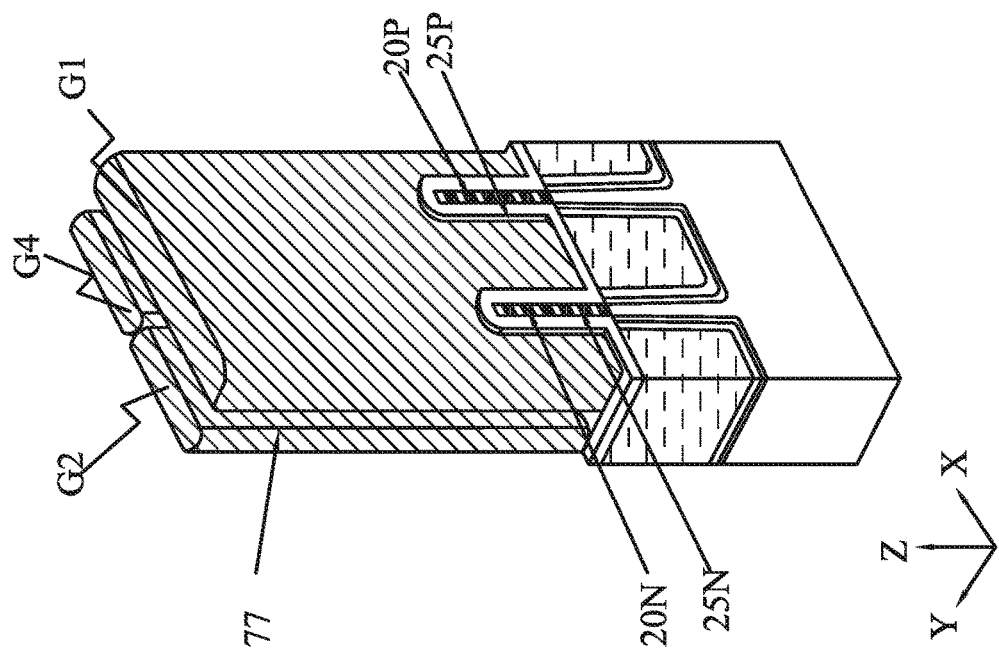
FIG. 7 shows one of the stages of exemplary sequential processes for manufacturing a GAA FET device according to one embodiment of the present disclosure.

Next, a patterning operation is performed on the mask layer 71 and sacrificial gate electrode layer is patterned into the sacrificial gate structures G1-G5, as shown in FIG. 7. FIG. 7 illustrates a structure after a sacrificial gate structures are formed over the exposed fin structures. The sacrificial gate structures are formed over a portion of the fin structure which is to be a channel region. The sacrificial gate structures define the channel region of the GAA FET. Further, by patterning the sacrificial gate structure, the stacked layers of the first and second semiconductor layers are partially exposed on opposite sides of the sacrificial gate structure, as source/drain (S/D) regions. In this disclosure, a source and a drain are interchangeably used and the structures thereof are substantially the same.

In one embodiment shown in FIG. 7, the sacrificial gate structure G1 is formed over the fin structures Fp and Fn, while the sacrificial gate structures G2 and G3 are formed over only the fin structure Fp and the sacrificial gate structures G4 and G5 are formed over only the fin structure Fn. The configuration of the sacrificial gate structures is not limited to that of FIG. 7. The width of the sacrificial gate electrode layer 70 is in a range from about 5 nm to about 25 nm in some embodiments.

Figure 8:
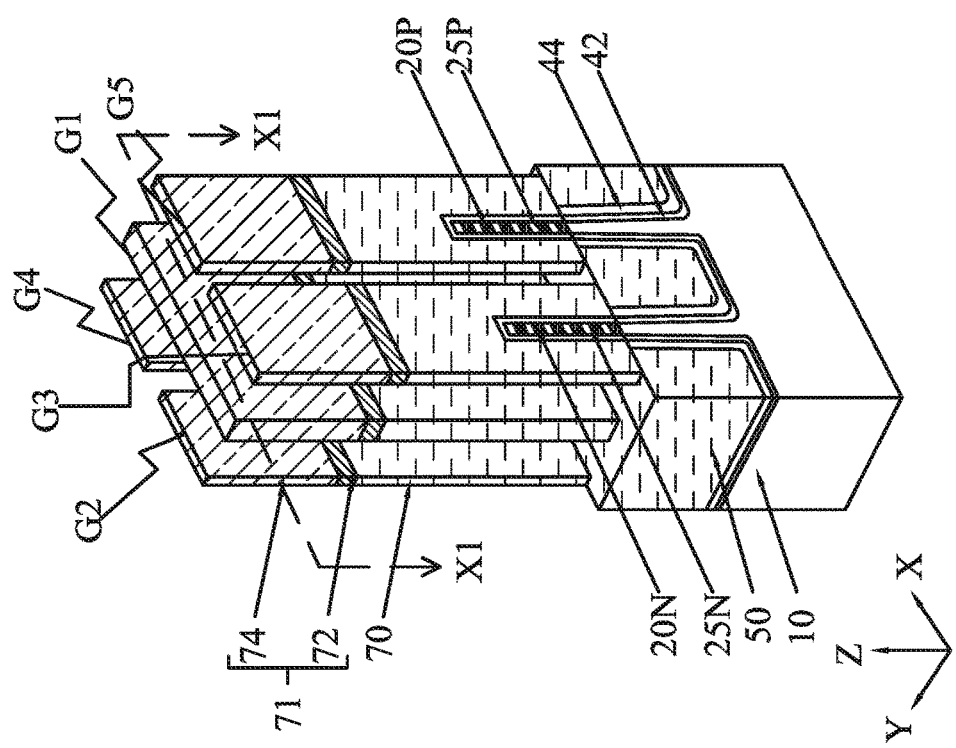
FIG. 8 shows one of the stages of exemplary sequential processes for manufacturing a GAA FET device according to one embodiment of the present disclosure.

After the sacrificial gate structure is formed, a blanket layer 77 of an insulating material for sidewall spacers is conformally formed by using CVD or other suitable methods, as shown in FIG. 8. FIG. 8 is a cut view corresponding to line X1-X1 of FIG. 7 (between G1 and G3, G5). The blanket layer 77 is deposited in a conformal manner so that it is formed to have substantially equal thicknesses on vertical surfaces, such as the sidewalls, horizontal surfaces, and the top of the sacrificial gate structure. In some embodiments, the blanket layer 77 is deposited to a thickness in a range from about 2 nm to about 10 nm. In one embodiment, the insulating material of the blanket layer 77 is a silicon nitride-based material, such as SiN, SiON, SiOCN or SiCN and combinations thereof.

Figure 9:
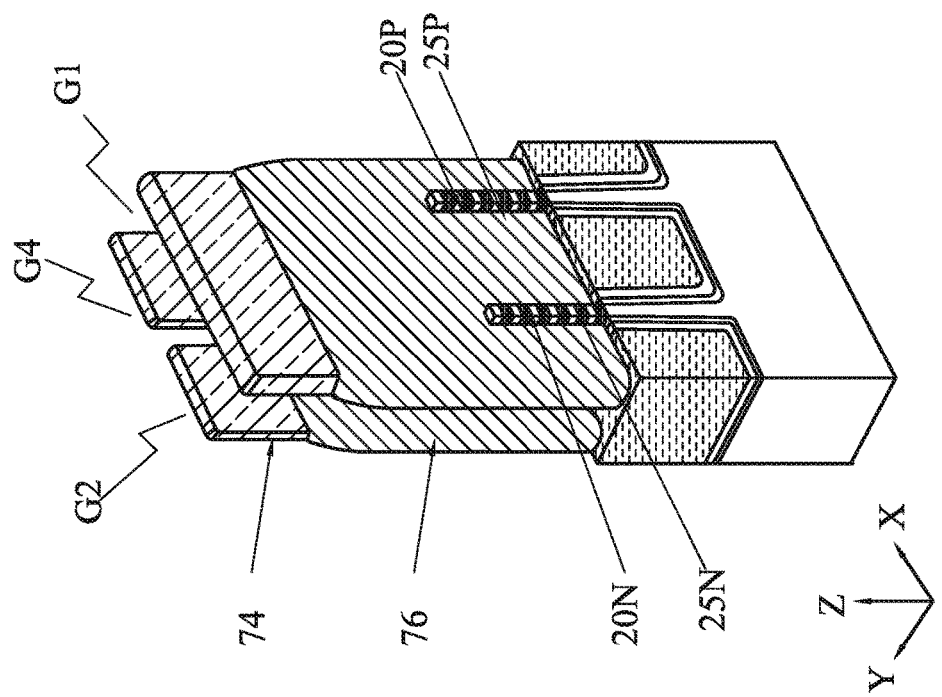
FIG. 9 shows one of the stages of exemplary sequential processes for manufacturing a GAA FET device according to one embodiment of the present disclosure.

Further, as shown in FIG. 9, side wall spacers 76 are formed on opposite sidewalls of the sacrificial gate structures. After the blanket layer 77 is formed, anisotropic etching is performed on the blanket layer 77 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 74 may be exposed from the sidewall spacers. In some embodiments, isotropic etching is subsequently performed to remove the insulating material from the sidewalls of the exposed fin structures Fn and Fp, as shown in FIG. 9. In other embodiments, the insulating material on the sidewalls of the fin structures is partially removed. In some embodiments, the isotropic etch is a wet etch process. After the sidewall spacers 76 are formed, the space between G1 and G2, G2 or G1 and G4, G5 is in a range from about 5 nm to about 25 nm in some embodiments.

Figure 10:
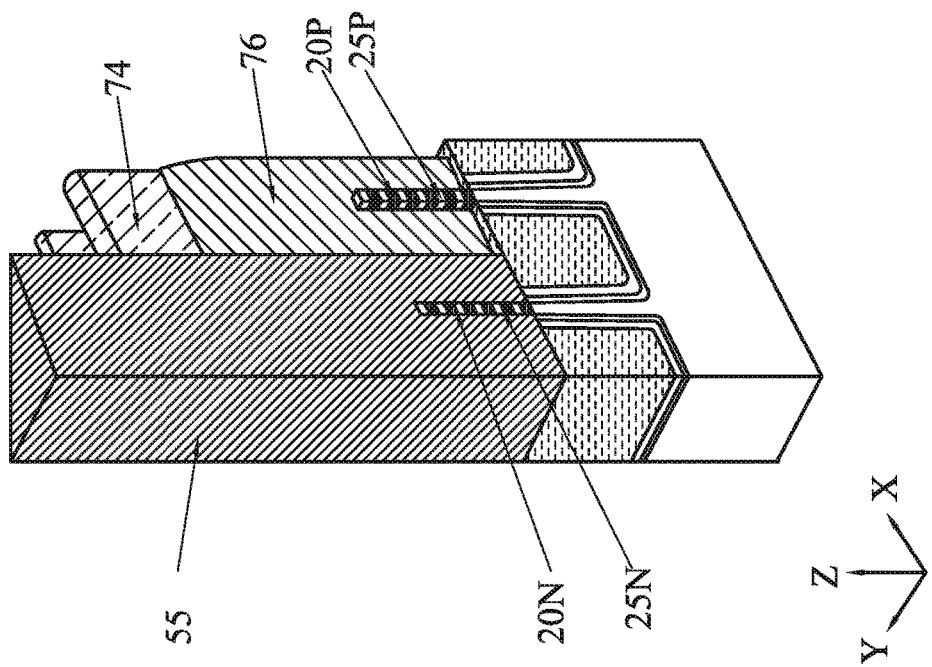
FIG. 10 shows one of the stages of exemplary sequential processes for manufacturing a GAA FET device according to one embodiment of the present disclosure.

Subsequently, the n-type FET region including the fin structure Fn is covered by a protective layer 55, as shown in FIG. 10. The protective layer 55 is made of SiN in some embodiments. The protective layer 55 can be formed by CVD and patterning operations.

Figure 11:
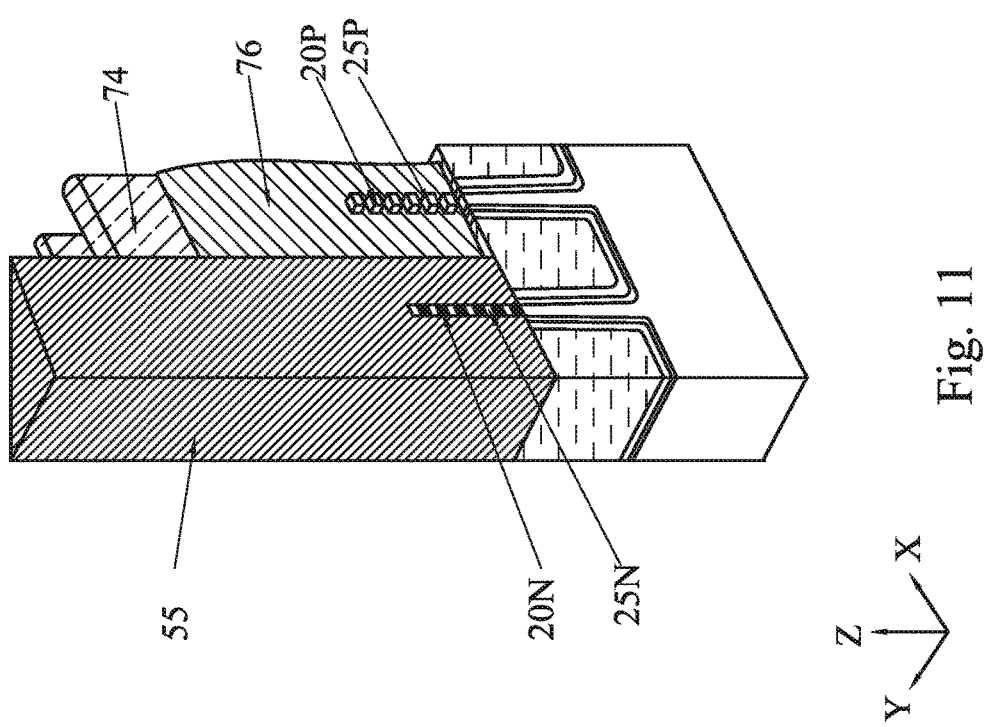
FIG. 11 shows one of the stages of exemplary sequential processes for manufacturing a GAA FET device according to one embodiment of the present disclosure.

After the n-type FET region is covered by the protective layer 55, the first semiconductor layers 20P in the S/D region of the fin structure Fp are removed, as shown in FIG. 11.

The first semiconductor layers 20P can be removed or etched using an etchant that can selectively etch the first semiconductor layers 20P against the second semiconductor layers 25P.

When the first semiconductor layers 20P are Ge or SiGe and the second semiconductor layers 25P are Si, the first semiconductor layers 20P can be selectively removed using a wet etchant such as, but not limited to ammonium hydroxide (NH$_4$OH), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

When the first semiconductor layers 20P are Si and the second semiconductor layers 25P are Ge or SiGe, the first semiconductor layers 20P can be selectively removed using a wet etchant such as, but not limited to ammonium hydroxide (NH$_4$OH), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

FIGS. 12A to 15B show the processes of etching the first semiconductor layers 20P in one embodiment of the present disclosure. FIGS. 12A, 13A, 14A and 15A show the cross sectional view of the S/D regions along the X direction, and FIGS. 12B, 13B, 14B and 15B show the cross sectional view of the fin structures along the Y direction.

FIGS. 12A, 13A, 14A and 15A also show the isolation insulating layer 50, and the first liner layer 42 and the second liner layer 44. FIGS. 12B, 13B, 14B and 15B also show the sacrificial gate dielectric layer 75, the sacrificial gate electrode layer 70 and the sidewall spacers 76.

FIGS. 12A and 12B show the structures after the S/D region of the fin structure Fp is exposed. FIGS. 13A and 13B show the structures after the first semiconductor layers 20P are removed at the S/D region of the fin structure Fp. At the stage of FIGS. 13A and 13B, the end portions of the first semiconductor layers 20P are located at the plane including the side face of the sidewall spacer 76.

In some embodiments, the first semiconductor layers 20P are further horizontally etched under the sacrificial gate structure, as shown in FIGS. 14A and 14B. At the stage of FIGS. 14A and 14B, the end portions of the first semiconductor layers 20P are located below the sidewall spacer 76. The amount W2 of the etching is more than about 0 nm and less than the thickness of the sidewall spacers 76. In some embodiments, W2 is in a range from about 1 nm to about 5 nm, and is in a range from about 2 nm to about 4 nm in other embodiments.

Further, in some embodiments, the second semiconductor layers 25P are also etched when the first semiconductor layers 20P are removed, as shown in FIGS. 15A and 15B. The amount W2' of the remaining second semiconductor layers 25P is in a range from about 1 nm to about 10 nm in some embodiments.

FIGS. 16A-16D show the structures after the S/D epitaxial layer 80P for the p-type FET is formed. FIG. 16B shows a cross sectional view along the fin structure Fp. FIG. 16C shows the cross sectional view of the S/D regions along the X direction, and FIG. 16D shows the cross sectional view of the fin structures along the Y direction. The S/D epitaxial layer 80P includes one or more of SiGe and Ge. As shown in FIG. 16C, the S/D epitaxial layer 80P wraps around the second semiconductor layers 25P.

Figure 17:
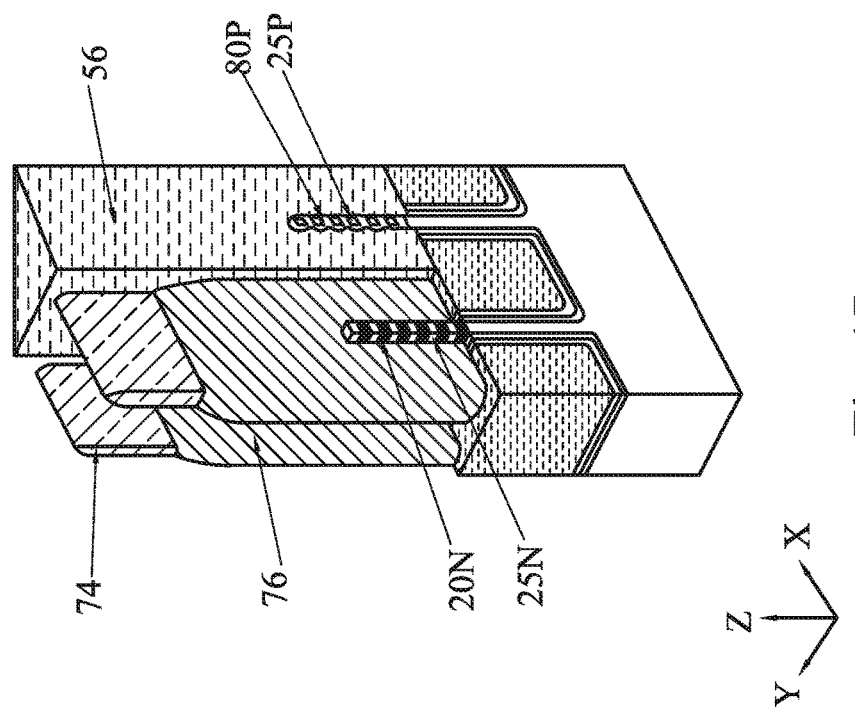
FIG. 17 shows one of the stages of exemplary sequential processes for manufacturing a GAA FET device according to one embodiment of the present disclosure.

After the S/D epitaxial layer 80P is formed, the S/D epitaxial layer 80N is formed while the p-type region is covered by a protective layer 56. As shown in FIG. 17, the protective layer 55 in the n-type region is removed and the p-type region is covered by the protective layer 56.

Figure 18:
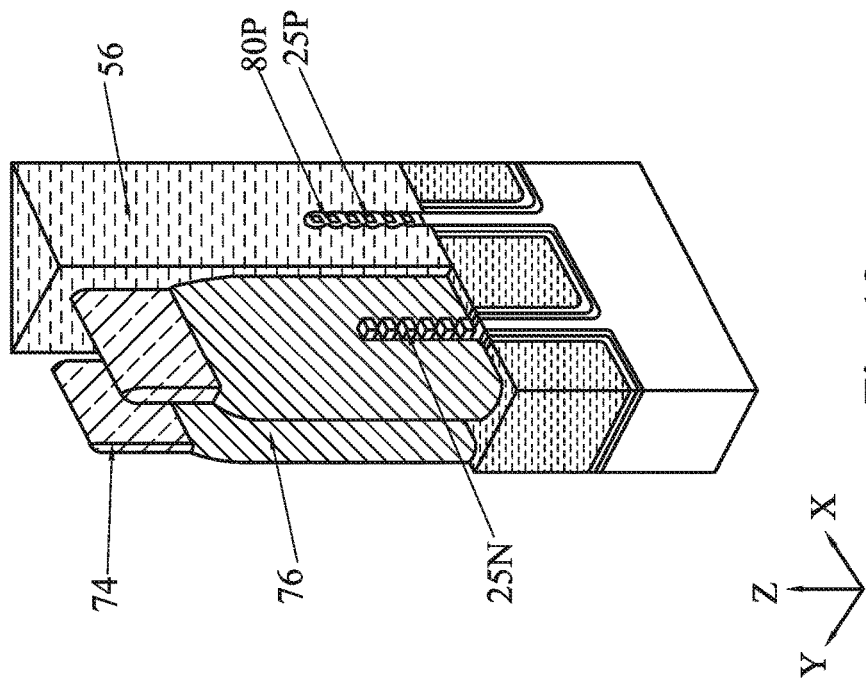
FIG. 18 shows one of the stages of exemplary sequential processes for manufacturing a GAA FET device according to one embodiment of the present disclosure.

Next, as shown in FIG. 18, similar to the operation of FIG. 11, the first semiconductor layers 20N of the S/D region are removed.

FIGS. 19A to 22B show the processes of etching the first semiconductor layers 20N in one embodiment of the present disclosure. FIGS. 19A, 20A, 21A and 22A show the cross sectional view of the S/D regions along the X direction, and FIGS. 19B, 20B, 21B and 22B show the cross sectional view of the fin structures along the Y direction.

FIGS. 19A, 20A, 21A and 22A also show the isolation insulating layer 50, and the first liner layer 42 and the second liner layer 44. FIGS. 19B, 20B, 21B and 22B also show the sacrificial gate dielectric layer 75, the sacrificial gate electrode layer 70 and the sidewall spacers 76.

FIGS. 19A and 19B show the structures after the S/D region of the fin structure Fn is exposed. FIGS. 20A and 20B show the structures after the first semiconductor layers 20N are removed at the S/D region of the fin structure Fn. At the stage of FIGS. 20A and 20B, the end portions of the first semiconductor layers 20N are located at the plane including the side face of the sidewall spacer 76.

In some embodiments, the first semiconductor layers 20N are further horizontally etched under the sacrificial gate structure, as shown in FIGS. 21A and 21B. At the stage of FIGS. 21A and 21B, the end portions of the first semiconductor layers 20N are located below the sidewall spacer. The amount W3 of the etching is more than about 0 nm and less than the thickness of the sidewall spacers 76. In some embodiments, W3 is in a range from about 1 nm to about 5 nm, and is in a range from about 2 nm to about 4 nm in other embodiments.

Further, in some embodiments, the second semiconductor layers 25N are also etched when the first semiconductor layers 20N are removed, as shown in FIGS. 22A and 22B. The amount W3' of the remaining second semiconductor layers 25N is in a range from about 1 nm to about 10 nm in some embodiments.

FIGS. 23A-23C show the structures after the S/D epitaxial layer 80N for the n-type FET is formed. FIG. 23B shows the cross sectional view of the S/D regions along the X direction, and FIG. 23C shows the cross sectional view of the fin structures along the Y direction. The S/D epitaxial layer 80N includes one or more of SiC, SiP and SiCP. As shown in FIG. 23B, the S/D epitaxial layer 80N wraps around the second semiconductor layers 25N.

The S/D epitaxial layers 80P and 80N are formed by an epitaxial growth method using CVD, ALD or molecular beam epitaxy (MBE). The order of forming the S/D epitaxial layers 80P and 80N can be exchangeable.

Figure 24:
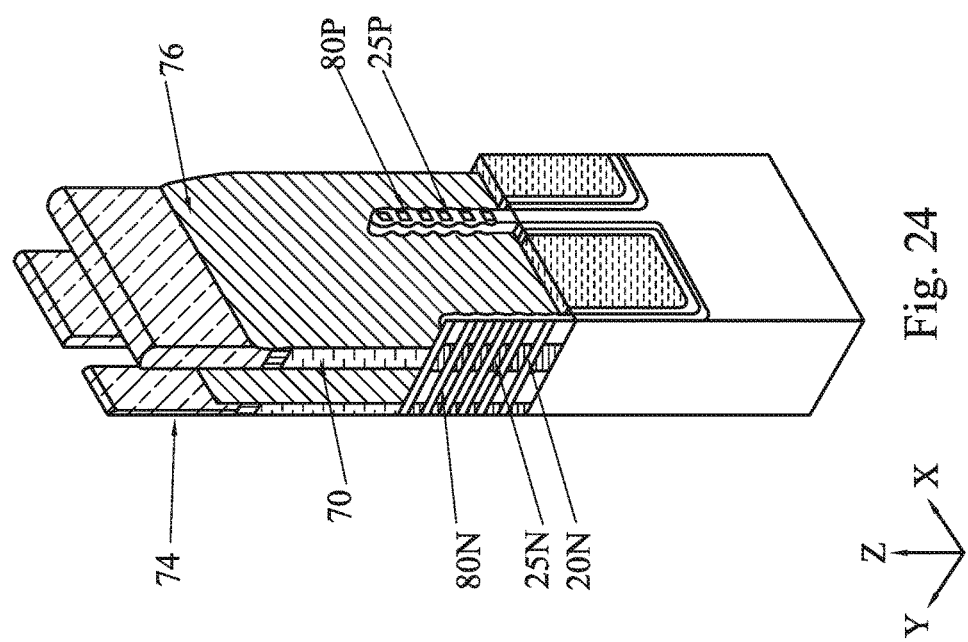
FIG. 24 shows one of the stages of exemplary sequential processes for manufacturing a GAA FET device according to one embodiment of the present disclosure.

After the S/D epitaxial layer 80N is formed, the protective layer 56 is removed. FIG. 24 shows a cross sectional view along the fin structure Fn after the S/D epitaxial layers 80P and 80N are formed and the protective layer is removed.

Figure 25:
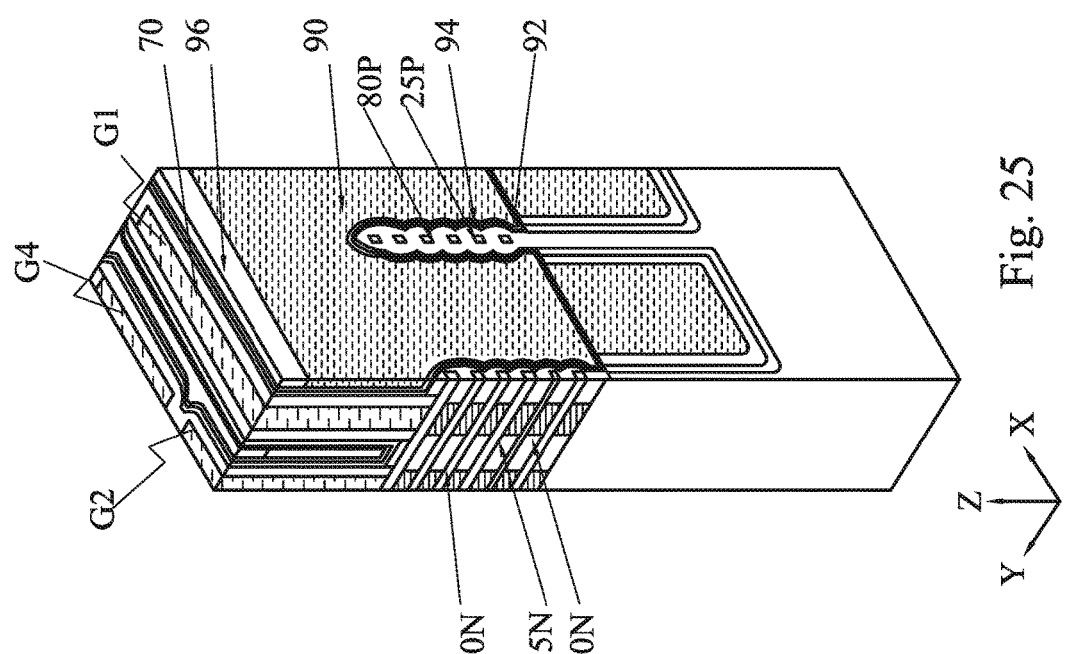
FIG. 25 shows one of the stages of exemplary sequential processes for manufacturing a GAA FET device according to one embodiment of the present disclosure.

After the S/D epitaxial layers are formed, an interlayer dielectric layer (ILD) 90 is formed over the entire structures and then the upper portion of the interlayer dielectric layer 90 is planarized by a CMP operation so that the upper surface of the sacrificial gate electrode layers 70 are exposed, as shown in FIG. 25.

The materials for the ILD layer 90 include compounds comprising Si, O, C and/or H, such as SiCOH and SiOC. Organic material, such as polymers, may be used for the ILD layer 90. Further, in some embodiments, before forming the ILD layer 90, a silicon oxide layer 92 is formed over the structure of FIG. 24, and further a SiN layer 94 is formed over the oxide layer 92. A SiN layer 96 may also be formed over the ILD layer 90 to protect the ILD layer 90 from being etched during subsequent etching of sacrificial gate dielectric layer.

Figure 26A:
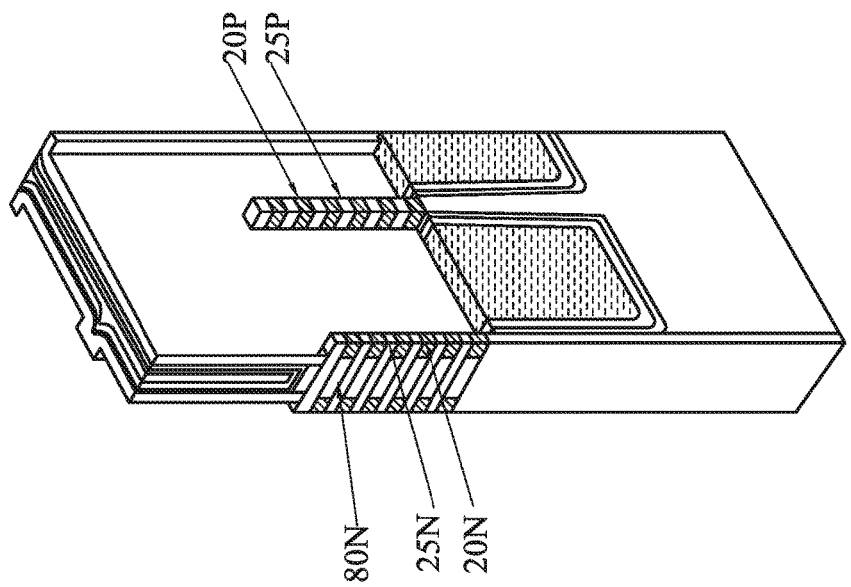
FIG. 26A and FIG. 26B shows one of the stages of exemplary sequential processes for manufacturing a GAA FET device according to one embodiment of the present disclosure.
Figure 26B:
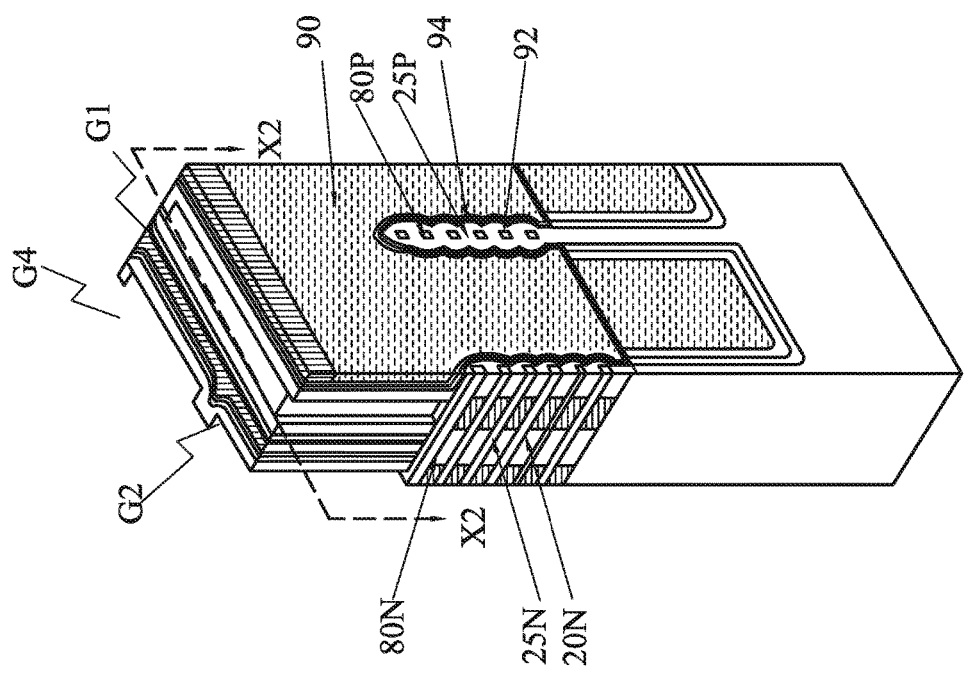

Subsequently, as shown in FIGS. 26A and 26B, the sacrificial gate electrodes 70 and sacrificial gate dielectric layers 75 are removed, thereby exposing the fin structures Fp and Fn, which subsequently become channel layers of the GAA FETs. FIG. 26B is a cut view corresponding to line X2-X2 of FIG. 26A.

The ILD layer 90 protects the S/D structures 80P and 80N during the removal of the sacrificial gate structures. The sacrificial gate structures can be removed using plasma dry etching and/or wet etching. When the sacrificial gate electrode 70 is polysilicon and the ILD layer 90 is silicon oxide, a wet etchant such as a TMAH solution can be used to selectively remove the sacrificial gate electrodes 70. The sacrificial gate dielectric layer 75 is thereafter removed using plasma dry etching and/or wet etching.

After the sacrificial gate structures are removed, wire structures for the channel layers are formed. In some embodiments of the present disclosure, the wire structures for the n-channel layers (an n-type FET) and those for the p-channel layers (a p-type FET) are separately formed.

As shown in FIG. 27, the p-type region is covered by a protective layer 57. Further, the first semiconductor layers 20N are removed so that the wire structures of the second semiconductor layers 25N are formed.

FIGS. 28A-29C show the processes of etching the first semiconductor layers 20N in the channel region in one embodiment of the present disclosure. FIGS. 28A-28C show the structures before the first semiconductor layers 20N are removed, and FIGS. 29A-29C show the structures after the first semiconductor layers 20N are removed. FIGS. 28A and 29A show the cross sectional view along the Y direction, FIGS. 28B and 29B show the cross sectional view of the channel region along the X direction, and FIGS. 28C and 29C show the cross sectional view of the S/D region along the X direction.

As shown in FIGS. 28A-28C, the S/D epitaxial layer 80N is formed at the S/D region of the n-type FET under the first ILD layer 90 and the sidewall spacers 76. The first semiconductor layers 20N are removed from the channel region by using a wet etching operation, as shown in FIGS. 29A-29C. The etching operations similar to the etching operation for the S/D regions can be employed for the etching operation for the channel region.

In one embodiment of the present disclosure, the S/D epitaxial layer 80N is formed of SiP, SiC or SiCP, while the first semiconductor layers 20N are formed of SiGe. Accordingly, the etching of the first semiconductor layers 20N stops at the S/D epitaxial layer 80N. This structure can prevent from the gate electrode from contacting the S/D epitaxial layer.

In other embodiments, the wire structures are formed by the first semiconductor layers 20N by selectively removing the second semiconductor layers 25N from the channel region.

After the wire structures (channel layers) for the n-type FET are formed, the protective layer 57 is removed, and the channel layers for the p-type FET are formed while the n-type region is covered by a protective layer.

For the p-type FET, the second semiconductor layers 25P are partially etched as shown in FIGS. 30A and 30B. FIG. 30A show the structures before the second semiconductor layers 25P are etched, and FIG. 30B show the structures after the second semiconductor layers 25P are partially etched. As shown in FIG. 30B, the adjacent first semiconductor layers 25N are not fully separated but are connected by the etched second semiconductor layers 25P. Thus, the channel layer for the P-type FET includes both the first and second semiconductor layers. In this case, stress applied by the remaining second semiconductor layers 25P to the first semiconductor layers 20P is maintained, while a relatively larger surface area of the S/D layer 80P can be obtained.

In some embodiments, as shown in FIG. 30C, the etched second semiconductor layers 25P have a substantially rectangular cross sectional shape. The thickness W4 of the etched second semiconductor layers 25P is in a range from about 1 nm to about 15 nm in some embodiments.

Figure 31:
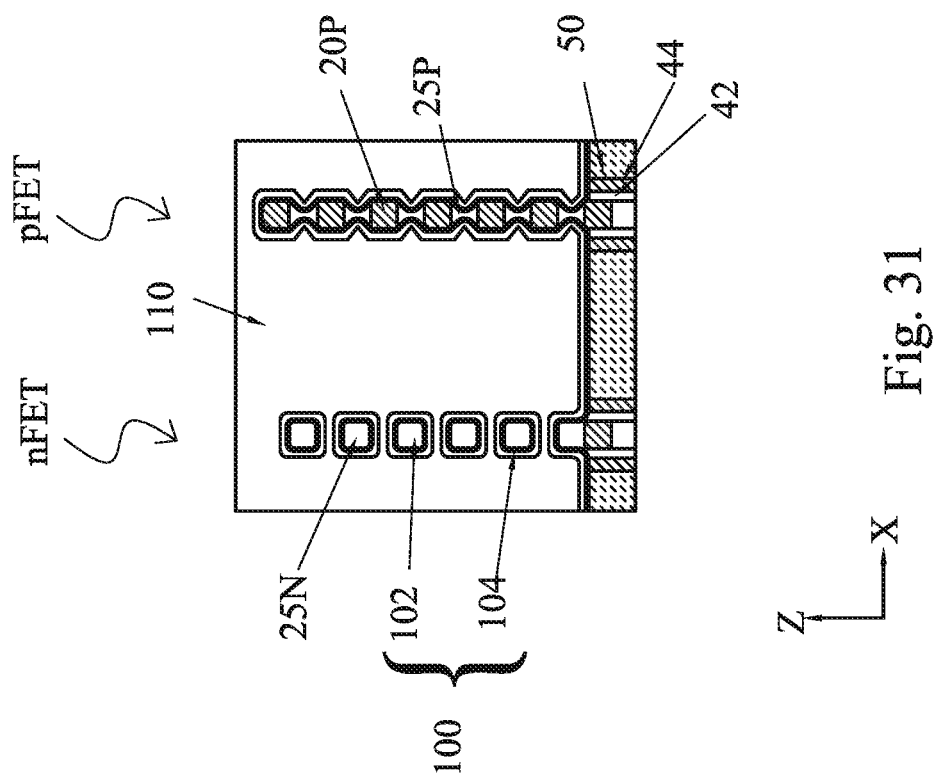
FIG. 31 shows one of the stages of exemplary sequential processes for manufacturing a GAA FET device according to one embodiment of the present disclosure.

After the channel layers for the n-type and p-type FETs are formed, a gate dielectric layer 100 is formed around each channel layers, and a gate electrode layer 110 is formed on the gate dielectric layer 100, as shown in FIG. 31. It is noted that the structure shown in FIG. 30C can be applied in the structure shown in FIG. 31.

In certain embodiments, the gate dielectric layer 100 includes one or more layers of a dielectric material 104, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 100 includes an interfacial layer 102 formed between the channel layers and the dielectric material 104.

The gate dielectric layer 100 may be formed from CVD, ALD or any suitable method. In one embodiment, the gate dielectric layer 100 is formed using a highly conformal deposition process such as ALD in order to ensure the formation of a gate dielectric layer having a uniform thickness around each channel layers. The thickness of the gate dielectric layer 100 is in a range from about 1 nm to about 6 nm in one embodiment.

The gate electrode layer 110 is formed on the gate dielectric layer 100 to surround each channel layers. The gate electrode 110 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 110 may be formed from CVD, ALD, electro-plating, or other suitable method. The gate electrode layer is also deposited over the upper surface of the ILD layer 90. The gate dielectric layer and the gate electrode layer formed over the ILD layer 90 is then planarized by using, for example, CMP, until the top surface of the ILD layer 90 or the SiN layer 96 is revealed.

In certain embodiments of the present disclosure, one or more work function adjustment layers (not shown) are interposed between the gate dielectric layer 100 and the gate electrode 110. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

FIGS. 32A-35B show the processes for forming the S/D region in other embodiments of the present disclosure. Similar to FIGS. 12A-15B, FIGS. 32A, 33A, 34A and 35A show the cross sectional view of the S/D regions along the X direction, and FIGS. 32B, 33B, 34B and 35B show the cross sectional view of the fin structures along the Y direction. FIGS. 32A-35B show the S/D region for an n-type FET and the substantially similar operations can be applied to a p-type FET. Unlike FIGS. 12A-15B, the second semiconductor layers are removed from the S/D region.

FIGS. 32A and 32B show the structures after the S/D region of the fin structure Fn is exposed. FIGS. 33A and 33B show the structures after the second semiconductor layers 25N are removed at the S/D region of the fin structure Fn. Further, in some embodiments, the remaining first semiconductor layers 20N are etched so that the diameter of the first semiconductor layers is reduced, as shown in FIGS. 34A and 34B.

Similar to FIGS. 14A and 14B, the second semiconductor layers 25N are horizontally etched under the sacrificial gate structure, as shown in FIGS. 33B and 34B. The end portions of the second semiconductor layers 25N are located below the sidewall spacer. The amount W3 of the etching is more than about 0 nm and less than the thickness of the sidewall spacers 76. In some embodiments, W3 is in a range from about 1 nm to about 5 nm, and is in a range from about 2 nm to about 4 nm in other embodiments.

Subsequently, as shown in FIGS. 35A and 35B, the S/D epitaxial layer 80N for the n-type FET is formed around the first semiconductor layers 20N. The S/D epitaxial layer 80N includes one or more of SiC, SiP and SiCP. As shown in FIG. 35A, the S/D epitaxial layer 80N wraps around the first semiconductor layers 20N.

FIGS. 36 and 37 show the processes for forming the channel layers in other embodiments of the present disclosure.

FIG. 36 is the structure for the n-type FET after the sacrificial gate structures are removed, which is subsequent to the structure of FIG. 35B, and substantially corresponds to FIG. 28A. In this embodiment, the first semiconductor layers 20N are removed from the channel region as shown in FIG. 37. Unlike FIG. 29A, since the S/D epitaxial layer 80N is formed between the first semiconductor layers in the S/D region, the S/D epitaxial layer 80N do not function as an etch stop layer for etching the first semiconductor layers 20N in the channel region. Accordingly, the etching of the first semiconductor layers 20N is controlled by, for example, etching time.

FIG. 38 is the structure for the p-type FET after the sacrificial gate structures are removed, which is subsequent to the structure of FIG. 35B, and substantially corresponds to FIG. 28A. Similar to FIGS. 30A and 30B, the second semiconductor layers 25P are partially etched, as shown in FIGS. 39A and 39B.

FIG. 40 shows the possible combinations of the S/D etching and the gate etching for the channel layer, and the corresponding figures, according to various embodiments of the present disclosure.

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, the S/D epitaxial layer can function as an etch stop layer in the channel etching operation, thereby preventing the metal gate electrode from contacting the S/D region. Thus, the GAA FET comprises stacked nanowires (Si and/or SiGe), in which manufacturing process, selective etching at a gate and a source/drain region is performed in the same process step. In the GAA FET, a source/drain layer is fully or partially epitaxially grown on etched Si or SiGe stacked layers, which enhances surface area for contact landings. Further, with the foregoing configuration, a more S/D epitaxial layer with a dopant can be grown, which reduces a contact resistance between the S/D epitaxial layer and the contact plus on the S/D epitaxial layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a stacked structure of first semiconductor layers and second semiconductor layers alternately stacked in a first direction is formed over a substrate. The stacked structure is patterned into a fin structure. A sacrificial gate structure is formed over the fin structure such that the sacrificial gate structure covers a part of the fin structure while remaining parts of the fin structure remain exposed. The remaining parts are source/drain regions and the part of the fin structure covered by the sacrificial gate structure is a channel region. The second semiconductor layers in the source/drain regions of the fin structure are removed, such that the first semiconductor layers in the source/drain regions are exposed and are spaced apart from each other. The second semiconductor layers in the channel region are recessed in a second direction perpendicular to the first direction toward inside the sacrificial gate structure. Epitaxial source/drain structures are formed on the exposed first semiconductor layers in the source/drain regions so that the epitaxial source/drain structures wrap around each of the exposed first semiconductor layers in the source/drain regions. The sacrificial gate structure is removed to expose the channel region of the fin structure. The second semiconductor layers in the exposed channel region of the fin structure are removed after removing the sacrificial gate structure so that the first semiconductor layers in the channel region are exposed. A gate dielectric layer and a gate electrode layer are formed around the exposed first semiconductor layers in the channel region.

In accordance with another aspect of the present disclosure, in a method of manufacturing a semiconductor device, a stacked structure of first semiconductor layers and second semiconductor layers alternately stacked in a first direction is formed over a substrate. The stacked structure is patterned into a first fin structure and a second fin structure. A sacrificial gate structure is formed over the first and second fin structures such that the sacrificial gate structure covers a part of the first fin structure and a part of the second fin structure, while remaining parts of the first and second fin structures remain exposed. The remaining parts are source/drain regions of the first and second fin structures, respectively. The part of the first fin structure covered by the sacrificial gate structure is a channel region of the first fin structure and the part of the second fin structure covered by the sacrificial gate structure is a channel region of the second fin structure. The second fin structure is covered with a first protective layer. The second semiconductor layers in the source/drain regions of the first fin structure are removed, such that the first semiconductor layers in the source/drain regions of the first fin structure are exposed and are spaced apart from each other. The second semiconductor layers in the channel region of the first fin structure are recessed in a second direction perpendicular to the first direction toward inside the sacrificial gate structure. First epitaxial source/drain structures are formed on the exposed first semiconductor layers in the source/drain regions of the first fin structure so that the first epitaxial source/drain structures wrap around each of the exposed first semiconductor layers in the source/drain regions of the first fin structure. The sacrificial gate structure over the first fin structure is removed to expose the channel region of the first fin structure. The second semiconductor layers in the exposed channel region of the first fin structure are removed after removing the sacrificial gate structure so that the first semiconductor layers in the channel region of the first fin structure are exposed. A gate dielectric layer and a gate electrode layer are formed around the exposed first semiconductor layers in the channel region of the first fin structure.

In accordance with another aspect of the present disclosure, a semiconductor device includes first channel layers disposed over a substrate, a first source/drain region disposed over the substrate, a gate dielectric layer disposed on and wrapping each of the first channel layers, and a gate electrode layer disposed on the gate dielectric layer and wrapping each of the first channel layers. Each of the first channel layers includes a semiconductor wire made of a first semiconductor material. The semiconductor wire extends into the first source/drain region. The semiconductor wire in the first source/drain regions is wrapped around by a second semiconductor material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a stacked structure of first semiconductor layers and second semiconductor layers alternately stacked in a first direction over a substrate;
    patterning the stacked structure into a fin structure;
    forming a sacrificial gate structure over the fin structure such that the sacrificial gate structure covers a part of the fin structure while remaining parts of the fin structure remain exposed, the remaining parts being source/drain regions and the part of the fin structure covered by the sacrificial gate structure being a channel region;
    removing the second semiconductor layers in the source/drain regions of the fin structure, such that the first semiconductor layers in the source/drain regions are exposed and are spaced apart from each other;
    recessing the second semiconductor layers in the channel region in a second direction perpendicular to the first direction toward inside the sacrificial gate structure;
    forming epitaxial source/drain structures on the exposed first semiconductor layers in the source/drain regions so that the epitaxial source/drain structures wrap around each of the exposed first semiconductor layers in the source/drain regions;

removing the sacrificial gate structure to expose the channel region of the fin structure;

removing the second semiconductor layers in the exposed channel region of the fin structure after removing the sacrificial gate structure so that the first semiconductor layers in the channel region are exposed; and forming a gate dielectric layer and a gate electrode layer around the exposed first semiconductor layers in the channel region.

2. The method of claim 1, further comprising, after the horizontally recessing the second semiconductor layers, partially etching the exposed first semiconductor layers in the source/drain regions.

3. The method of claim 1, wherein the first semiconductor layers are made of Si or a Si-based compound.

4. The method of claim 3, wherein the second semiconductor layers are made of SiGe.

5. The method of claim 3, wherein the epitaxial source/drain structures include at least one of SiP, SiCP and SiC.

6. The method of claim 3, wherein the epitaxial source/drain structures include SiGe or Ge.

7. The method of claim 1, further comprising forming sidewall spacer layers on both sidewalls of the sacrificial gate structure, wherein after the horizontally recessing the second semiconductor layers, at least one end face of the second semiconductor layers are located below one of the sidewall spacers.

8. The method of claim 1, wherein, in the removing the second semiconductor layers in the source/drain regions, the second semiconductor layers are removed by wet etching.

9. The method of claim 1, wherein, in the removing the second semiconductor layer in the exposed channel region, the second semiconductor layers are removed by wet etching.

10. A method of manufacturing a semiconductor device, comprising:

forming a stacked structure of first semiconductor layers and second semiconductor layers alternately stacked in a first direction over a substrate;

patterning the stacked structure into a first fin structure and a second fin structure;

forming a sacrificial gate structure over the first and second fin structures such that the sacrificial gate structure covers a part of the first fin structure and a part of the second fin structure, while remaining parts of the first and second fin structures remain exposed, the remaining parts being source/drain regions of the first and second fin structures, respectively, and the part of the first fin structure covered by the sacrificial gate structure being a channel region of the first fin structure and the part of the second fin structure covered by the sacrificial gate structure being a channel region of the second fin structure;

covering the second fin structure with a first protective layer;

removing the second semiconductor layers in the source/drain regions of the first fin structure, such that the first semiconductor layers in the source/drain regions of the first fin structure are exposed and are spaced apart from each other;

recessing the second semiconductor layers in the channel region of the first fin structure in a second direction perpendicular to the first direction toward inside the sacrificial gate structure;

forming first epitaxial source/drain structures on the exposed first semiconductor layers in the source/drain regions of the first fin structure so that the first epitaxial source/drain structures wrap around each of the exposed first semiconductor layers in the source/drain regions of the first fin structure;

removing the sacrificial gate structure over the first fin structure to expose the channel region of the first fin structure;

removing the second semiconductor layers in the exposed channel region of the first fin structure after removing the sacrificial gate structure so that the first semiconductor layers in the channel region of the first fin structure are exposed; and forming a gate dielectric layer and a gate electrode layer around the exposed first semiconductor layers in the channel region of the first fin structure.

11. The method of claim 10, further comprising:

removing the first protective layer;

covering with a second protective layer the second fin structures from which the second semiconductor layers in the channel region of the second fin structure are removed;

removing the second semiconductor layers in the source/drain regions of the second fin structure, such that the first semiconductor layers in the source/drain regions of the second fin structure are exposed and are spaced apart from each other;

recessing the second semiconductor layers in the channel region of the second fin structure in the second direction toward inside the sacrificial gate structure;

forming second epitaxial source/drain structures on the exposed first semiconductor layers in the source/drain regions of the second fin structure so that the second epitaxial source/drain structures wrap around each of the exposed first semiconductor layers in the source/drain regions of the second fin structure;

removing the sacrificial gate structure over the second fin structure to expose the channel region of the second fin structure;

removing the second semiconductor layers in the exposed channel region of the second fin structure after removing the sacrificial gate structure so that the first semiconductor layers in the channel region of the second fin structure are exposed; and forming a gate dielectric layer and a gate electrode layer around the exposed first semiconductor layers in the channel region of the second fin structure.

12. The method of claim 11, wherein the first semiconductor layers are made of Si or a Si-based compound.

13. The method of claim 12, wherein the second semiconductor layers are made of SiGe.

14. The method of claim 12, wherein:

the first epitaxial source/drain structures include SiGe or Ge, and the second epitaxial source/drain structures include at least one of SiP, SiCP and SiC.

15. The method of claim 10, further comprising:

removing the first protective layer;

covering with a second protective layer the second fin structures from which the second semiconductor layers in the channel region of the second fin structure are removed;

forming second epitaxial source/drain structures over the first and second semiconductor layers in the source/drain regions of the second fin structure;

removing the sacrificial gate structure over the second fin structure to expose the channel region of the second fin structure;

removing the second semiconductor layers in the exposed channel region of the second fin structure after removing the sacrificial gate structure so that the first semiconductor layers in the channel region of the second fin structure are exposed; and forming a gate dielectric layer and a gate electrode layer around the exposed first semiconductor layers in the channel region of the second fin structure.

16. The method of claim 15, wherein the first semiconductor layers are made of Si or a Si-based compound.

17. The method of claim 16, wherein the second semiconductor layers are made of SiGe.

18. The method of claim 16, wherein:
the first epitaxial source/drain structures include SiGe, and
the second epitaxial source/drain structures include at least one of SiP, SiCP and SiC.

19. A method of manufacturing a semiconductor device, comprising:
forming a stacked structure of first semiconductor layers and second semiconductor layers alternately stacked in a first direction over a substrate;
patterning the stacked structure into a fin structure;
forming a sacrificial gate structure over the fin structure such that the sacrificial gate structure covers a part of the fin structure while remaining parts of the fin structure remain exposed, the remaining parts being source/drain regions and the part of the fin structure covered by the sacrificial gate structure being a channel region;
removing the second semiconductor layers in the source/drain regions of the fin structure, such that the first semiconductor layers in the source/drain regions are exposed and are spaced apart from each other;
recessing the second semiconductor layers in the channel region in a second direction perpendicular to the first direction toward inside the sacrificial gate structure;
forming epitaxial source/drain structures on the exposed first semiconductor layers in the source/drain regions so that the epitaxial source/drain structures wrap around each of the exposed first semiconductor layers in the source/drain regions;
removing the sacrificial gate structure to expose the channel region of the fin structure;
partially removing the second semiconductor layers in the exposed channel region of the fin structure after removing the sacrificial gate structure so that part of the first semiconductor layers in the channel region are exposed; and
forming a gate dielectric layer and a gate electrode layer around the exposed first semiconductor layers and remaining second semiconductor layers in the channel region.

20. The method of claim 19, further comprising, after the horizontally recessing the second semiconductor layers, partially etching the exposed first semiconductor layers in the source/drain regions.

* * * * *